(12) United States Patent
Erdogan

(10) Patent No.: US 8,258,839 B2
(45) Date of Patent: Sep. 4, 2012

(54) 1 TO $2^{N}-1$ FRACTIONAL DIVIDER CIRCUIT WITH FINE FRACTIONAL RESOLUTION

(75) Inventor: Mustafa U. Erdogan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 97 days.

(21) Appl. No.: 12/905,594

(22) Filed: Oct. 15, 2010

(65) Prior Publication Data

US 2012/0092051 A1    Apr. 19, 2012

(51) Int. Cl.
    *H03L 7/06* (2006.01)
(52) U.S. Cl. .................. 327/158; 327/156; 327/161
(58) Field of Classification Search .......... 327/156, 327/158, 161
    See application file for complete search history.

(56) References Cited

U.S. PATENT DOCUMENTS

| | | | |
|---|---|---|---|
| 6,114,914 A | 9/2000 | Mar | |
| 6,236,703 B1 | 5/2001 | Riley | |
| 6,807,552 B2 | 10/2004 | Bredin et al. | |
| 7,295,077 B2 | 11/2007 | Thomsen et al. | |
| 7,417,510 B2 | 8/2008 | Huang | |
| 7,595,670 B2 | 9/2009 | Hermann | |
| 7,764,134 B2 | 7/2010 | Fu et al. | |
| 7,800,451 B2 | 9/2010 | Fu et al. | |
| 7,839,225 B2 * | 11/2010 | Huang | 331/74 |

OTHER PUBLICATIONS

"A High-Frequency Phase-Compensation Fractional_N Frequency Synthesizer," IEEE International Symposium on Circuits and Systems, 2005 ISCAS, May 23-26, 2005, pp. 5091-5094 (Ching-Yuan Yang; Jen-Wen Chen; Meng-Ting Tsai).

\* cited by examiner

*Primary Examiner* — John Poos
(74) *Attorney, Agent, or Firm* — John J. Patti; Wade J. Brady, III; Frederick J. Telecky, Jr.

(57) ABSTRACT

A fractional divider has been provided that allows for division ratios of 1:1 to $1:2^{N-1}$ with fine fractional resolution. To accomplish this, a phase blender (which is under the control of a state machine) is used to "blend" or interpolate consecutive phases of a clock signal from a delay locked loop to achieve a low deterministic jitter, while a sigma delta modulator can also be used to maintain low deterministic jitter while achieving the desired frequency resolution.

19 Claims, 5 Drawing Sheets

1 TO $2^N$-1 FRACTIONAL DIVIDER CIRCUIT WITH FINE FRACTIONAL RESOLUTION

TECHNICAL FIELD

The invention relates generally to divider and, more particularly, to a fractional divider.

BACKGROUND

Phase locked loops (PLLs) have been used for frequency synthesis in many conventional circuits, and these PLLs generally included internal and/or external dividers. These PLLs (and the corresponding dividers) have also been used to generate fractional frequencies, but, usually, at a price (namely, spurs and jitter). Therefore, there is a need for an improved fractional divider that can be used with or within a PLL or reference clock generator.

Some examples of conventional circuits are: U.S. Pat. No. 6,114,914; U.S. Pat. No. 6,236,703; U.S. Pat. No. 6,807,552; U.S. Pat. No. 7,295,077; U.S. Pat. No. 7,417,510; U.S. Pat. No. 7,595,670; U.S. Pat. No. 7,764,134; U.S. Pat. No. 7,800,451; and Yang et al., "A High-Frequency Phase Compensation Fractional-N Frequency Synthesizer," *IEEE International Symposium on Circuits and Systems,* 2005 ISCAS, May 23-26, 2005, pp. 5091-5094.

SUMMARY

A preferred embodiment of the present invention, accordingly, provides an apparatus. The apparatus comprises a delay locked loop (DLL) having a plurality of taps; a phase blender that is coupled to receive signals from consecutive taps of the DLL; a state machine that is coupled to the phase blender so as to provide control word to the phase blender; a toggle circuit that is coupled to the phase blender and the state machine; a duty cycle correction circuit that is coupled to the toggle circuit; and a sigma delta modulator that is coupled to the toggle circuit and the state machine.

In accordance with another preferred embodiment of the present invention, the apparatus further comprises a multiplexer that is coupled to each tap of the DLL and the phase blender.

In accordance with another preferred embodiment of the present invention, the apparatus further comprises a plurality of latches, wherein each latch is coupled to at least one of the taps of the DLL, the multiplexer, and the state machine, wherein the state machine controls the multiplexer.

In accordance with another preferred embodiment of the present invention, the multiplexer further comprises a first multiplexer, and wherein the apparatus further comprises a second multiplexer that is coupled to the duty cycle correction circuit and the toggle circuit.

In accordance with another preferred embodiment of the present invention, the phase blender further comprises: an activation circuit; a capacitor that is coupled to the activation circuit; and a plurality of binary weighted branches that are each coupled in parallel to the capacitor.

In accordance with another preferred embodiment of the present invention, the activation circuit further comprises: an OR gate that receives the signals from consecutive taps of the DLL; and a transistor that is coupled to the OR gate.

In accordance with another preferred embodiment of the present invention, the transistor further comprises a first transistor, and wherein each branch further comprises: a second transistor receives at least one of the signals from consecutive taps of the DLL; and a third transistor that is coupled to the second transistor and that receives at least a portion of the control word from the state machine.

In accordance with another preferred embodiment of the present invention, an apparatus is provided. The apparatus comprises a clock signal generator; a plurality of fractional clock dividers, wherein each fractional clock divider is coupled to the clock generator, and wherein each fractional clock divider includes: a DLL having a plurality of taps; a phase blender that is coupled to receive signals from consecutive taps of the DLL; a state machine that is coupled to the phase blender so as to provide control word to the phase blender; a toggle circuit that is coupled to the phase blender and the state machine; a duty cycle correction circuit that is coupled to the toggle circuit; and a sigma delta modulator that is coupled to the toggle circuit; and a plurality of buffers, wherein each buffer is coupled to at least one of the fractional clock dividers.

In accordance with another preferred embodiment of the present invention, the clock generator is a phase locked loop (PLL).

In accordance with another preferred embodiment of the present invention, an apparatus is provided. The apparatus comprises a prescaler that provides an input clock signal; a DLL that is coupled to the prescaler, wherein the DLL includes a plurality of taps, wherein each tap generates at least one of a plurality of phases of the input clock signal; a first multiplexer that is coupled to each tap from the DLL; a phase blender that is coupled to the first multiplexer so as to receive a first phase and a second phase from the DLL, wherein the first phase and the second phase are consecutive; a plurality of latches, wherein each latch is coupled to at least one of the taps of the DLL and the first multiplexer; a state machine that is coupled to the phase blender and to each of the latches, wherein the state machine provides control word to the phase blender and provides at least one of a plurality of select signals to each of the latches so as to select the first and second phases; a toggle circuit that is coupled to the phase blender and the state machine, wherein the state machine provides an enable signal to the toggle circuit; a duty cycle correction circuit that is coupled to the toggle circuit; a sigma delta modulator that is coupled to the toggle circuit and the state machine; a divider that is coupled to the duty cycle correction circuit; and a second multiplexer that is coupled to the toggle circuit and the divider.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
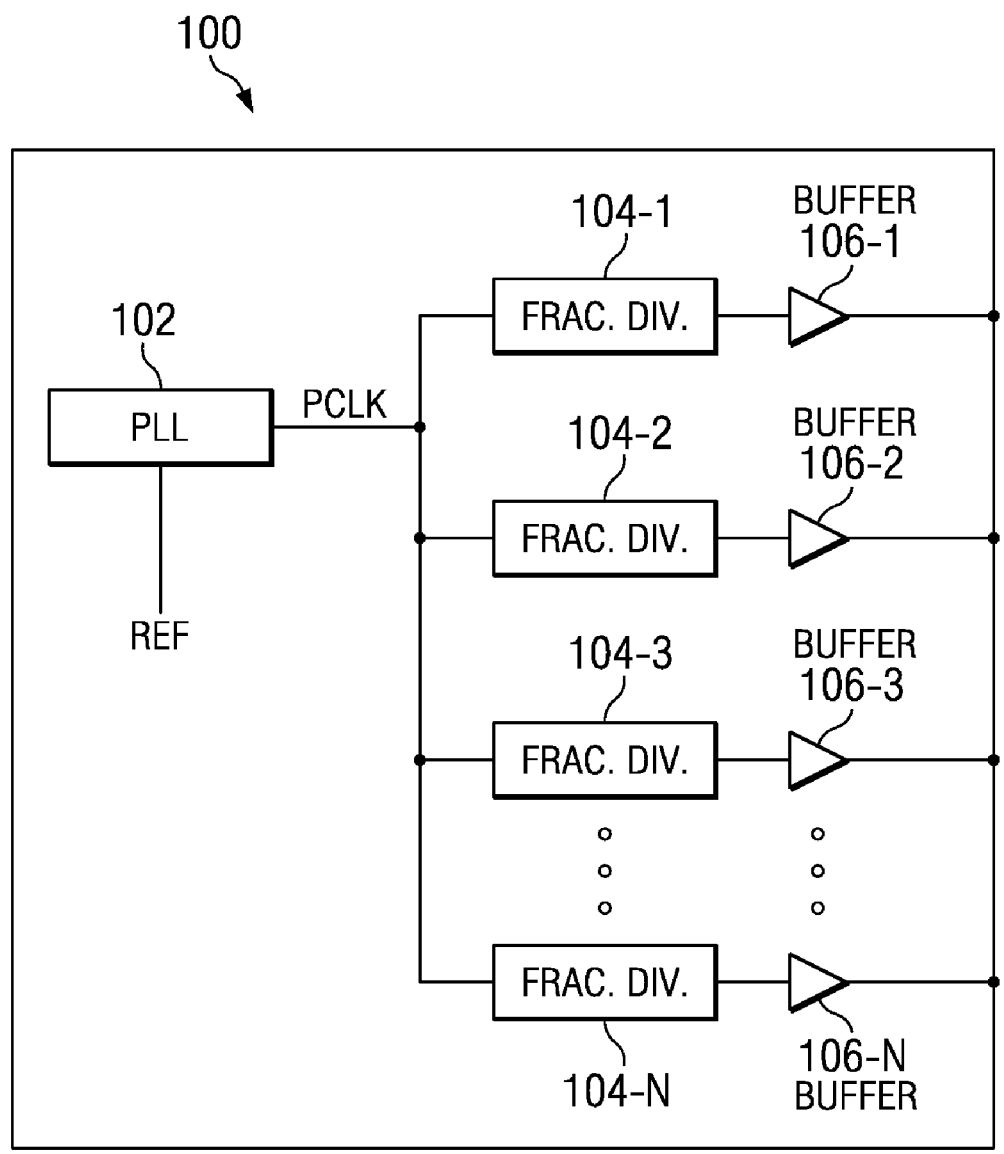
FIG. 1 is a block diagram of an example of a system in accordance with a preferred embodiment of the present invention.

Refer now to the drawings wherein depicted elements are, for the sake of clarity, not necessarily shown to scale and wherein like or similar elements are designated by the same reference numeral through the several views.

Figure 2:
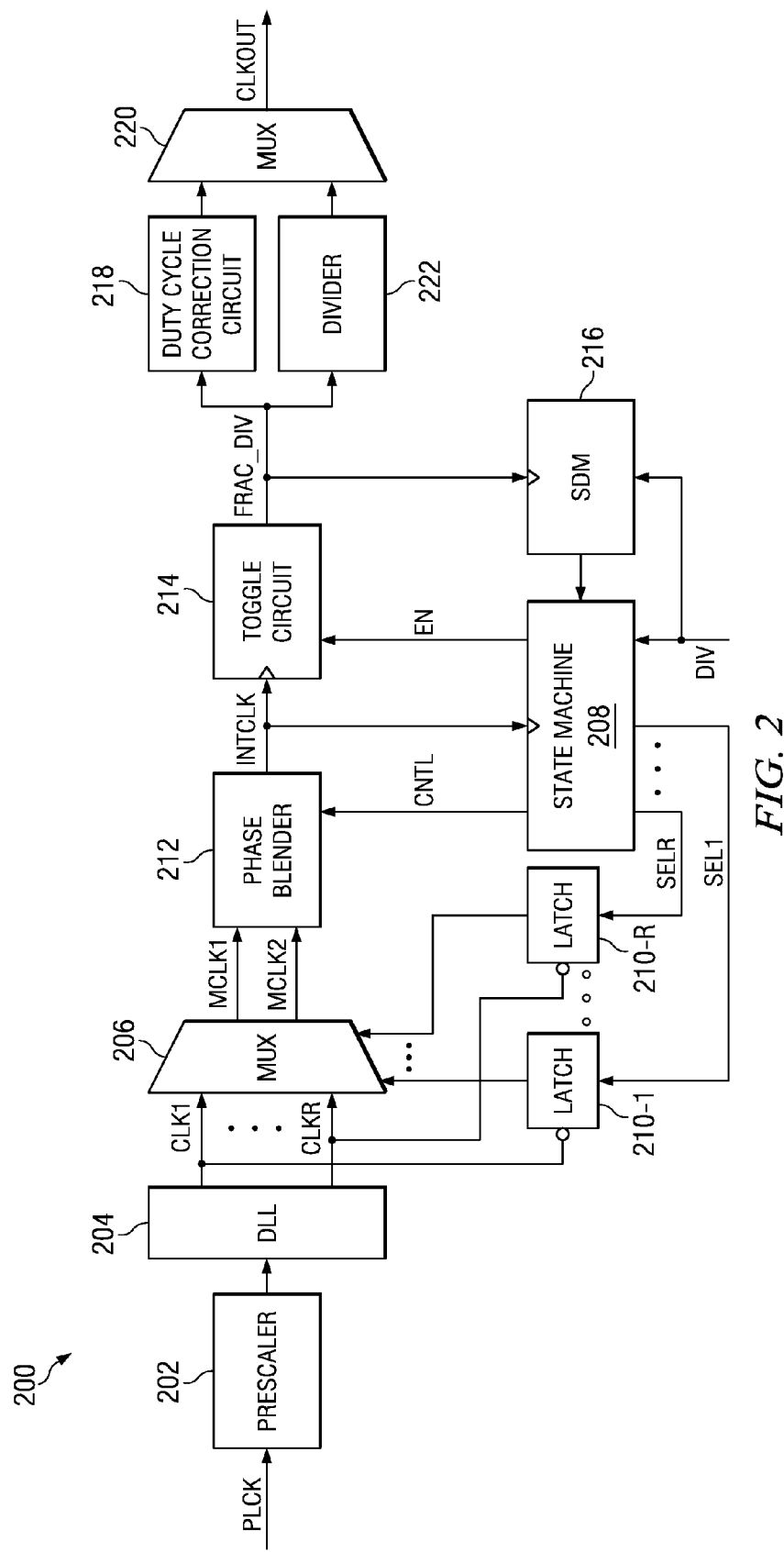
FIG. 2 is a circuit diagram of an example of a frequency divider of FIG. 1.

Turning to FIG. 1, an example of a system 100 in accordance with a preferred embodiment of the present invention can be seen. Typically, system 100 can be a frequency synthesizing integrated circuit or IC that generates several divided clock signals from a reference clock signal REF. As shown, system 100 generally comprises a PLL 102, frequency dividers 104-1 to 104-N, and buffers 106-1 to 106-N. Generally, the PLL 102 (which can internally include a fractional divider) operates as a clock generator or clock generation circuit that generates a main clock signal PCLK from reference clock signal REF, while the frequency dividers 104-1 to 104-N (which, for example, can each have a division ratio from 1:1 to $1:2^N-1$) generate divided clock signals that are output through buffers 106-1 to 106-N. A more detailed example of the fractional dividers 104-1 to 104-N (hereinafter 104) can be seen in FIG. 2, and divider 104 generally comprises a prescaler 202, a delay locked loop (DLL) 204, a multiplexers or muxes 206 and 220, state machine 208, latches 210-1 to 210-R, phase blender or interpolator 212, toggle circuit 214, duty cycle correction circuit or DCC, and sigma-delta modulator or SDM 216, and divider 222.

Figure 4:
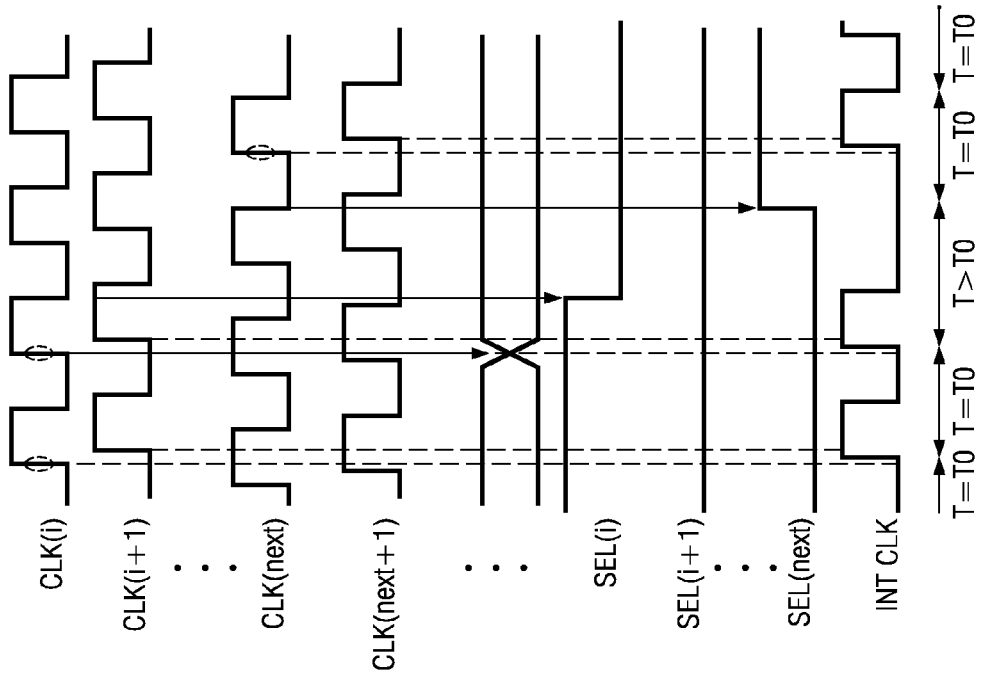
FIGS. 4 through 6 are timing diagrams illustrating the operation of the frequency divider of FIG. 2.
Figure 5:
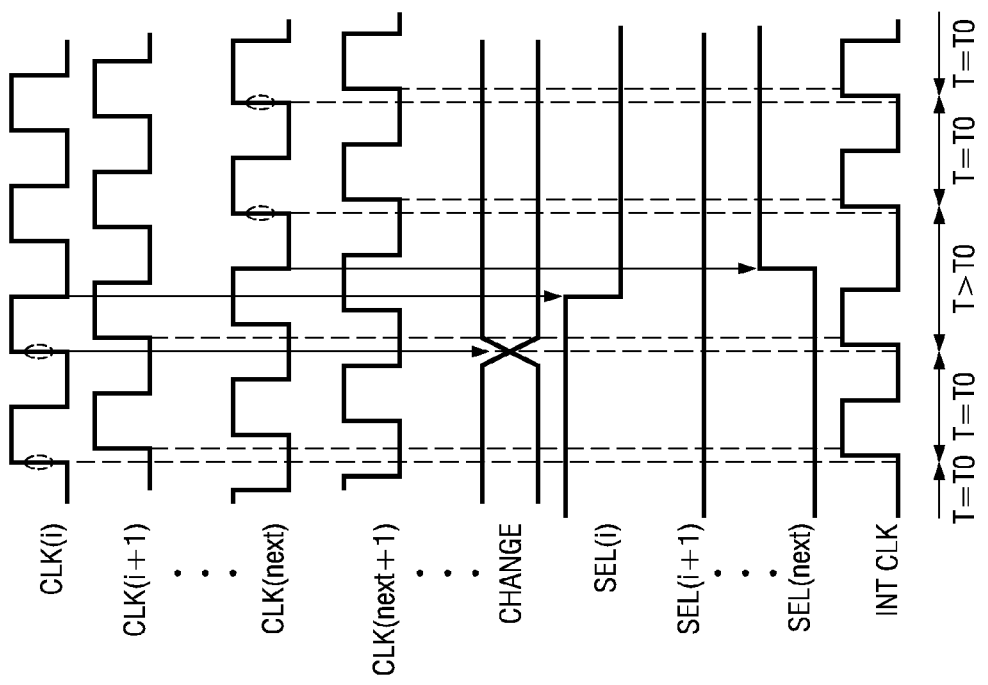

In operation, divider 104 receives the clock signal PCLK from PLL 102 and generates a divided clock signal CLKOUT based on a control word DIV that indicates the magnitude of division. Typically, the control word DIV can, for example, be 30 bits long having 10 bits for an integer setting, 8 bits for a coarse fractional setting, and 12 bits for a fine fractional setting. Generally, the prescaler 202 divides the clock signal PCLK for use by the DLL 204 (e.g., divided by two). The DLL 204, which has several taps (i.e., 16), can generate several phases CLK1 to CLKR of the prescaled clock signal (from prescaler 202) at these taps. Each of these phases CLK1 to CLKR of the prescaled clock signal are generally provided to the input terminals of mux 206 and state machine 208. Each phase CLK1 to CLKR can also be provided to a respective latch 210-1 to 210-R (which may be configured to operate as D flip-flops or latches depending on the fractional part of the divided ratio). The state machine 208 (which can receive the integer setting and coarse fractional setting from the control word DIV) controls the mux 206 (through latches 210-1 top 210-R with the use of select signals SEL1 to SELR) so as to select consecutive phases MCLK1 and MCLK2 (which, for example, can correspond to phases CLK(i) and CLK(i+1) as shown in FIGS. 4 and 5) from phases CLK1 to CLKR that are input into mux 206. The phase blender 212 generally generates finer intermediate phases by interpolating the consecutive phases MCLK1 and MCLK2, and the output INTCLK of phase blender 212 can then be used as a clocking signal for toggle circuit 214 (which may be a D flip-flop) that is enabled by the state machine 208 (which can provide enable signal EN). This output signal FRAC_DIV from the toggle circuit 214 can then be provided to the DCC 218, and divider 220. Mux 220 can then select between the outputs of divider 220 (which can, for example, be a divide-by-2 divider) and the DCC 218 (which can be based on control word DIV) so as to refine the output clock signal CLKOUT. Additionally, the output signal FRAC_DIV of toggle circuit 214 can be provided to SDM 216 (which can also receive the fine fractional setting from control word DIV and which may be a first order SDM) so that the SDM 216 can provide a control signal to the state machine 208 to dither the output clock signal CLKOUT between two blended phases derived from consecutive phases MCLK1 and MCLK2 to generate the fine divide ratios and generally maintain a low deterministic jitter.

Figure 3:
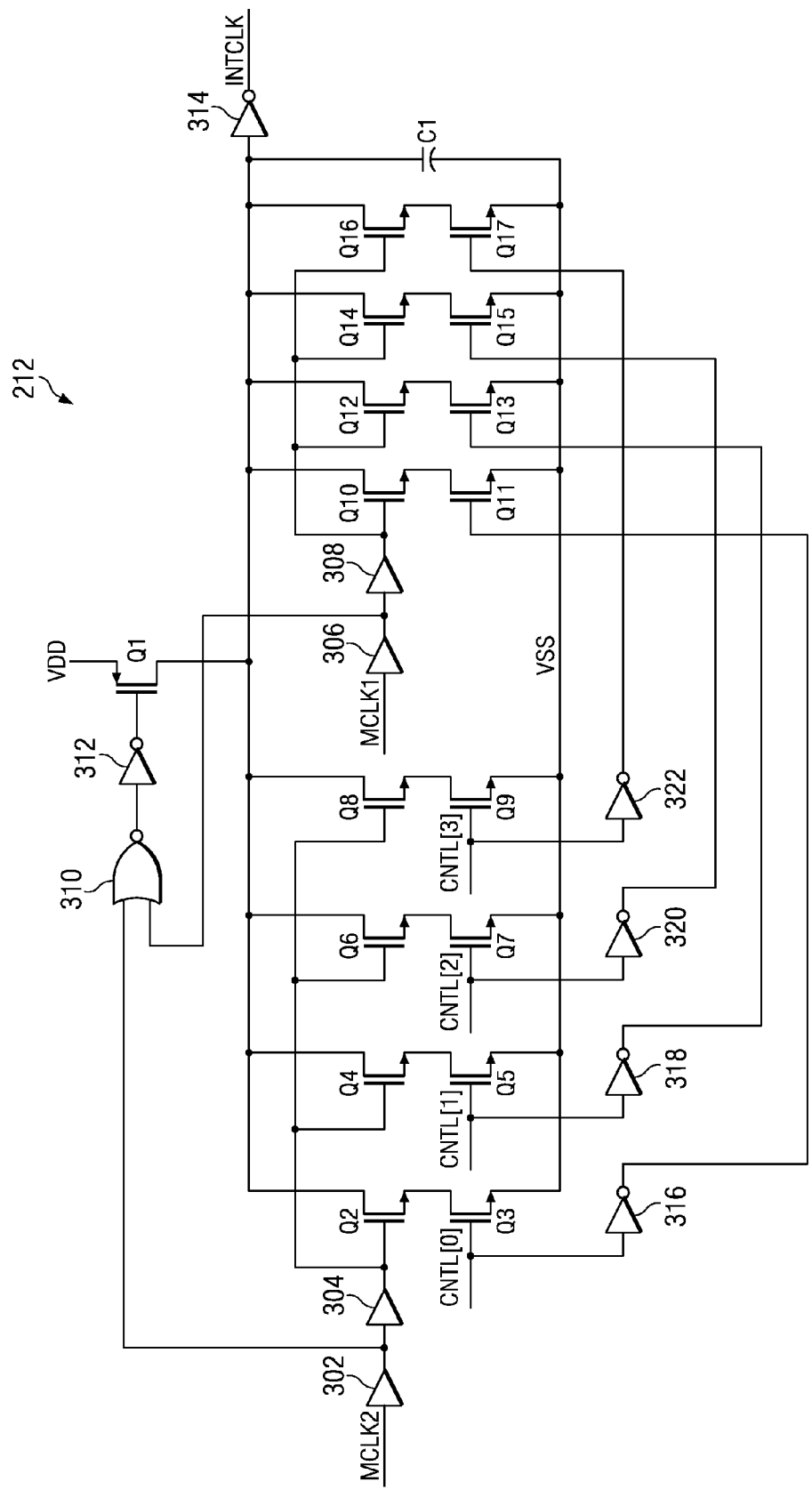
FIG. 3 is a circuit diagram of an example of a phase blender of FIG. 2.

Turning now to FIG. 3, an example of the phase blender 212 can be seen in greater detail. As shown in this example, phase blender 212 receives a 4-bit control word CNTL that activates and deactivates binary weighted branches. Larger or smaller control words and corresponding circuitry may also be used. Here, the phase blender 212 generally comprises a first set of branches (i.e., transistors Q2/Q3, Q4/Q5, Q6/Q7, and Q8/Q9, which may be NMOS transistors), a second set of branches (i.e., transistors Q10/Q11, Q12/Q13, Q14/Q15, and Q16/Q17, which may be NMOS transistors), a capacitor C1, inverters 314, 316, 318, 320, and 322, buffers 302, 304, 306, and 308, and an activation circuit (i.e., NOR gate 310, inverter 312, and transistor Q1, which may be a PMOS transistor). Typically, when both of the clock phases or clock signals MCLK1 or MCLK2 are logic low or "0", transistor Q1 is activated so as to couple the voltage rail VDD to each branch. Preferably, clock phase or signal MCLK1 is received (through buffers 306 and 308) by transistors Q2, Q4, Q6, and Q8, while clock phase or signal MCLK2 is received (through buffers 302 and 304) by transistors Q10, Q12, Q14, and Q16. Each of the bits CNTL[0], CNTL[1], CNTL[2], and CNTL[3] of control word CNTL can then be provided to transistors Q3, Q5, Q7, and Q9, respectively, while the inverse of bits CNTL[0], CNTL[1], CNTL[2], and CNTL[3] (which can be provided through inverters 316, 318, 320, and 322, respectively) can be respectively provided to transistors Q11, Q13, Q15, and Q17. Thus, the control word CNTL can control the balance between or can "blend" clock phases MCLK1 and MCLK2 so as to adjust the rising and falling edges of signal INTCLK to be between the respective rising and falling edges of phases MCLK1 and MCLK2. An example of this "blending" can be seen in FIGS. 4 and 5.

In FIGS. 4 and 5, examples of switching of clock phases by the state machine 208 can be seen. In operation, as described above, the state machine 208 generally selects two consecutive phases MCLK1 and MCLK2 by use of selection signals SEL1 to SELR. FIG. 4 shows an example of switching when the phase difference is less than one-half of the period of the prescaled clock signal, while FIG. 5 shows an example of switching when the phase difference is greater than one-half of the period of the prescaled clock signal. As shown in both FIGS. 4 and 5, the two consecutive phases MCLK1 and MCLK2 correspond to clock signals CLK(i) and CLK(i+1) (which correspond to taps i and i+1 from DLL 204). Looking to the first two rising edges of signal INTCLK (which is output from phase blender 212 and toggle circuit 214) shown, these rising edges are between corresponding rising edges of the signals CLK(i) and CLK(i+1), which is as a result of the "blending" from phase blender 212. A signal indicating a change or switching event CHANGE generally occurs with a rising edge of signal CLK(i) depending on the value of DIV control signal. Following the indication of a switching event, the state machine 208 working with the latches 210 can de-assert select signal SEL(i) on the next falling edge of signal CLK(i) and assert signal SEL(next) on the next falling edge of signal CLK(next) so that the next rising edge of signal INTCLK (which is generally output from toggle circuit 214)

can be blended in phase between CLK(next) and CLK(next+1). That way, the state machine 208 can select a different phase every clock cycle adding a fraction of an input period to the clock signal INTCLK to achieve the desired fractional divide ratio.

Figure 6:
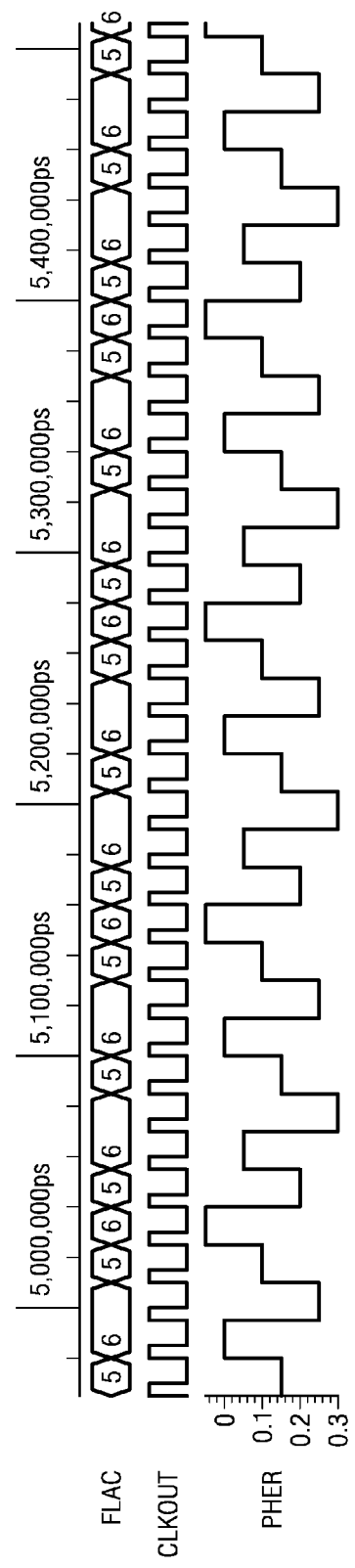

Turning to FIG. 6, a simplified example of the operation of divider 104 can be seen. In this example, the division ratio is 1:4.703125 (where the integer setting is 4, the coarse fractional setting is ⅝, and the fine fractional setting is ⅝) for a DLL 208 that has, for example, 8 phases. As shown, the state machine 208 switches clock phases (similar to the examples shown in FIGS. 4 and 5) in a pattern to generate the desired division ratio. The pattern for switching can be seen with the signal FRAC which corresponds to portion of the control word DIV that generally corresponds to the coarse fractional setting and fine fractional setting. In this example, the pattern is ⅝, ⁶⁄₈, ⁶⁄₈, ⅝, ⁶⁄₈, ⁶⁄₈, ⁶⁄₈, and ⁶⁄₈, which generally creates a phase error PHER between about −0.625 and 0.125 and a total error of 0.75. In general, the phase error can be limited to the phase difference between the outputs of the phase blender, (i.e., ½₅₆th of the prescaled clock in FIG. 2).

As a result of using fraction divider 104, several advantages can be realized. Since the divider 104 is not inside PLL 102, the combination of multiple phases of a DLL 204 and phase interpolator or blender 212 can generate a clock signal with low deterministic jitter, and SDM 216 can be used to maintain a low deterministic jitter to a minimum while achieving the desired frequency resolution. This, in turn, allows divider 104 to be able to achieve fractional divide ratios other than 1/N (where N is an integer). Additionally, having the divider 104 outside the PLL 203 also allows independent optimization of the settings for PLL 102. Additionally, due to the much smaller quantization error of this fractional divider 104 compared to a multi-modulus divider (where an integer divider is switched between different divide ratios to obtain the desired fractional divide ratio) spurs and jitter of the fractional divider can be reduced significantly.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
a delay locked loop (DLL) having a plurality of taps;
a phase blender that is coupled to receive signals from consecutive taps of the DLL;
a state machine that is coupled to the phase blender so as to provide control word to the phase blender;
a toggle circuit that is coupled to the phase blender and the state machine;
a duty cycle correction circuit that is coupled to the toggle circuit; and
a sigma delta modulator that is coupled to the toggle circuit and state machine.

2. The apparatus of claim 1, wherein the apparatus further comprises a multiplexer that is coupled to each tap of the DLL and the phase blender.

3. The apparatus of claim 2, wherein the apparatus further comprises a plurality of latches, wherein each latch is coupled to at least one of the taps of the DLL, the multiplexer, and the state machine, wherein the state machine controls the multiplexer.

4. The apparatus of claim 3, wherein the multiplexer further comprises a first multiplexer, and wherein the apparatus further comprises a second multiplexer that is coupled to the duty cycle correction circuit and the toggle circuit.

5. The apparatus of claim 4, wherein the phase blender further comprises:
an activation circuit;
a capacitor that is coupled to the activation circuit; and
a plurality of binary weighted branches that are each coupled in parallel to the capacitor.

6. The apparatus of claim 5, wherein the activation circuit further comprises:
an OR gate that receives the signals from consecutive taps of the DLL; and
a transistor that is coupled to the OR gate.

7. The apparatus of claim 6, wherein the transistor further comprises a first transistor, and wherein each branch further comprises:
a second transistor receives at least one of the signals from consecutive taps of the DLL; and
a third transistor that is coupled to the second transistor and that receives at least a portion of the control word from the state machine.

8. The apparatus of claim 6, wherein the transistor further comprises a first transistor, and wherein each branch further comprises:
a first NMOS transistor receives at least one of the signals from consecutive taps of the DLL at its gate and that is coupled to the source of the PMOS transistor at its drain; and
a third transistor that is coupled to the source second transistor at its drain and that receives at least a portion of the control word from the state machine at its gate.

9. The apparatus of claim 8, wherein the clock generator is a phase locked loop (PLL).

10. An apparatus comprising:
a clock signal generator;
a plurality of fractional clock dividers, wherein each fractional clock divider is coupled to the clock generator, and wherein each fractional clock divider includes:
a DLL having a plurality of taps;
a phase blender that is coupled to receive signals from consecutive taps of the DLL;
a state machine that is coupled to the phase blender so as to provide control word to the phase blender;
a toggle circuit that is coupled to the phase blender and the state machine;
a duty cycle correction circuit that is coupled to the toggle circuit; and
a sigma delta modulator that is coupled to the toggle circuit and the state machine; and
a plurality of buffers, wherein each buffer is coupled to at least one of the fractional clock dividers.

11. The apparatus of claim 10, wherein the apparatus further comprises a multiplexer that is coupled to each tap of the DLL and the phase blender.

12. The apparatus of claim 11, wherein the apparatus further comprises a plurality of latches, wherein each latch is coupled to at least one of the taps of the DLL, the multiplexer, and the state machine, wherein the state machine controls the multiplexer.

13. The apparatus of claim 12, wherein the multiplexer further comprises a first multiplexer, and wherein the apparatus further comprises a second multiplexer that is coupled to the duty cycle correction circuit and the toggle circuit.

14. The apparatus of claim 13, wherein the phase blender further comprises:
an activation circuit;
a capacitor that is coupled to the activation circuit; and
a plurality of binary weighted branches that are each coupled in parallel to the capacitor.

15. The apparatus of claim 14, wherein the activation circuit further comprises:
an OR gate that receives the signals from consecutive taps of the DLL; and
a PMOS transistor that is coupled to the OR gate at its gate.

16. An apparatus comprising:
a prescaler that provides an input clock signal;
a DLL that is coupled to the prescaler, wherein the DLL includes a plurality of taps, wherein each tap generates at least one of a plurality of phases of the input clock signal;
a first multiplexer that is coupled to each tap from the DLL;
a phase blender that is coupled to the first multiplexer so as to receive a first phase and a second phase from the DLL, wherein the first phase and the second phase are consecutive;
a plurality of latches, wherein each latch is coupled to at least one of the taps of the DLL and the first multiplexer;
a state machine that is coupled to the phase blender and to each of the latches, wherein the state machine provides control word to the phase blender and provides at least one of a plurality of select signals to each of the latches so as to select the first and second phases;
a toggle circuit that is coupled to the phase blender and the state machine, wherein the state machine provides an enable signal to the toggle circuit;
a duty cycle correction circuit that is coupled to the toggle circuit;
a sigma delta modulator that is coupled to the toggle circuit and the state machine; a divider that is coupled to the duty cycle correction circuit; and
a second multiplexer that is coupled to the toggle circuit and the divider.

17. The apparatus of claim 16, wherein the phase blender further comprises:
an activation circuit;
a capacitor that is coupled to the activation circuit; and
a plurality of binary weighted branches that are each coupled in parallel to the capacitor.

18. The apparatus of claim 17, wherein the activation circuit further comprises:
an OR gate that receives the signals from consecutive taps of the DLL; and
a transistor that is coupled to the OR gate.

19. The apparatus of claim 18, wherein the transistor further comprises a first transistor, and wherein each branch further comprises:
a second transistor receives at least one of the signals from consecutive taps of the DLL; and
a third transistor that is coupled to the second transistor and that receives at least a portion of the control word from the state machine.

* * * * *